(12) United States Patent
Miyamoto et al.

(10) Patent No.: US 9,464,211 B2
(45) Date of Patent: Oct. 11, 2016

(54) CURABLE SILICONE COMPOSITION AND OPTICAL SEMICONDUCTOR DEVICE

(71) Applicant: DOW CORNGING TORAY CO., LTD., Tokyo (JP)

(72) Inventors: Yusuke Miyamoto, Ichihara (JP); Makoto Yoshitake, Ichihara (JP); Hiroaki Yoshida, Ichihara (JP); Toshiki Nakata, Ichihara (JP); Kazuo Hirai, Sodegaura (JP)

(73) Assignee: DOW CORNING TORAY CO., LTD., Tokyo (JP)

( * ) Notice: Subject to any disclaimer, the term of this patent is extended or adjusted under 35 U.S.C. 154(b) by 0 days.

(21) Appl. No.: 14/426,524

(22) PCT Filed: Sep. 6, 2013

(86) PCT No.: PCT/JP2013/074780
§ 371 (c)(1),
(2) Date: Mar. 6, 2015

(87) PCT Pub. No.: WO2014/038727
PCT Pub. Date: Mar. 13, 2014

(65) Prior Publication Data
US 2015/0218417 A1  Aug. 6, 2015

(30) Foreign Application Priority Data

Sep. 7, 2012  (JP) ................................ 2012-197421

(51) Int. Cl.
*H01L 33/56* (2010.01)
*C09D 183/04* (2006.01)
(Continued)

(52) U.S. Cl.
CPC ............. *C09D 183/04* (2013.01); *C08L 83/04* (2013.01); *C09J 183/04* (2013.01); *H01L 23/296* (2013.01);
(Continued)

(58) Field of Classification Search
CPC ............................................ H01L 2224/48247
See application file for complete search history.

(56) References Cited

U.S. PATENT DOCUMENTS 6,011,105 A  1/2000  Ota et al.
8,044,162 B2  10/2011  Morita et al.
(Continued)

FOREIGN PATENT DOCUMENTS

CN   101418123 A   4/2009
JP   2000-198930 A   7/2000
(Continued)

OTHER PUBLICATIONS

International Search Report for Application No. PCT/JP2013/074780 dated Mar. 6, 2014, 4 pages.
(Continued)

*Primary Examiner* — Fernando L Toledo
*Assistant Examiner* — Valerie N Newton
(74) *Attorney, Agent, or Firm* — Howard & Howard Attorneys PLLC

(57) ABSTRACT

The present invention relates to a curable silicone composition which is a hydrosilylation reaction curable silicone composition for sealing, coating, or adhering of an optical semiconductor element, and includes at least one type of compound selected from triazole-based compounds with the exception of benzotriazole. The curable silicone composition, for example, includes (A) an organopolysiloxane having at least 2 aliphatic unsaturated hydrocarbon groups per molecule, (B) an organopolysiloxane having at least two silicon-bonded hydrogen atoms per molecule, (C) at least one type of compound selected from among triazole-based compounds with the exception of non-substituted benzotriazole, and (D) a hydrosilylation reaction catalyst. The curable silicone composition forms a cured product having excellent transparency and thermal shock resistance, and the optical semiconductor device utilizing the composition has excellent reliability.

9 Claims, 1 Drawing Sheet

(51) Int. Cl.
*C08L 83/04* (2006.01)
*H01L 23/29* (2006.01)
*C09J 183/04* (2006.01)
*H01L 23/24* (2006.01)
*H01L 23/00* (2006.01)

(52) U.S. Cl.
CPC ............... *H01L 33/56* (2013.01); *H01L 23/24* (2013.01); *H01L 24/73* (2013.01); *H01L 2224/32245* (2013.01); *H01L 2224/48247* (2013.01); *H01L 2224/73265* (2013.01)

(56) References Cited

U.S. PATENT DOCUMENTS

| | | |
|---|---|---|
| 8,080,614 B2 | 12/2011 | Morita et al. |
| 2004/0106706 A1 | 6/2004 | Tanaka et al. |
| 2010/0085728 A1* | 4/2010 | Seto ............... C09K 11/0883 362/84 |
| 2010/0144933 A1 | 6/2010 | Irie |
| 2010/0216920 A1 | 8/2010 | Kato et al. |

FOREIGN PATENT DOCUMENTS

| | | |
|---|---|---|
| JP | 2005-076003 A | 3/2005 |
| JP | 2007-327019 A | 12/2007 |
| JP | 2008-001828 A | 1/2008 |
| WO | WO 93/21245 A1 | 10/1993 |

OTHER PUBLICATIONS

English language abstract and machine-assisted English translation for CN 101418123 extracted from espacenet.com database on Mar. 12, 2015, 29 pages.

English language abstract and machine-assisted English translation for JP 2000-198930 extracted from the PAJ database on Mar. 12, 2015, 27 pages.

English language abstract and machine-assisted English translation for JP 2005-076003 extracted from the PAJ database on Mar. 12, 2015, 13 pages.

English language abstract for JP 2007-327019 extracted from espacenet.com database on Mar. 12, 2015, 2 pages.

English language abstract for JP 2008-001828 extracted from espacenet.com database on Mar. 12, 2015, 2 pages.

\* cited by examiner

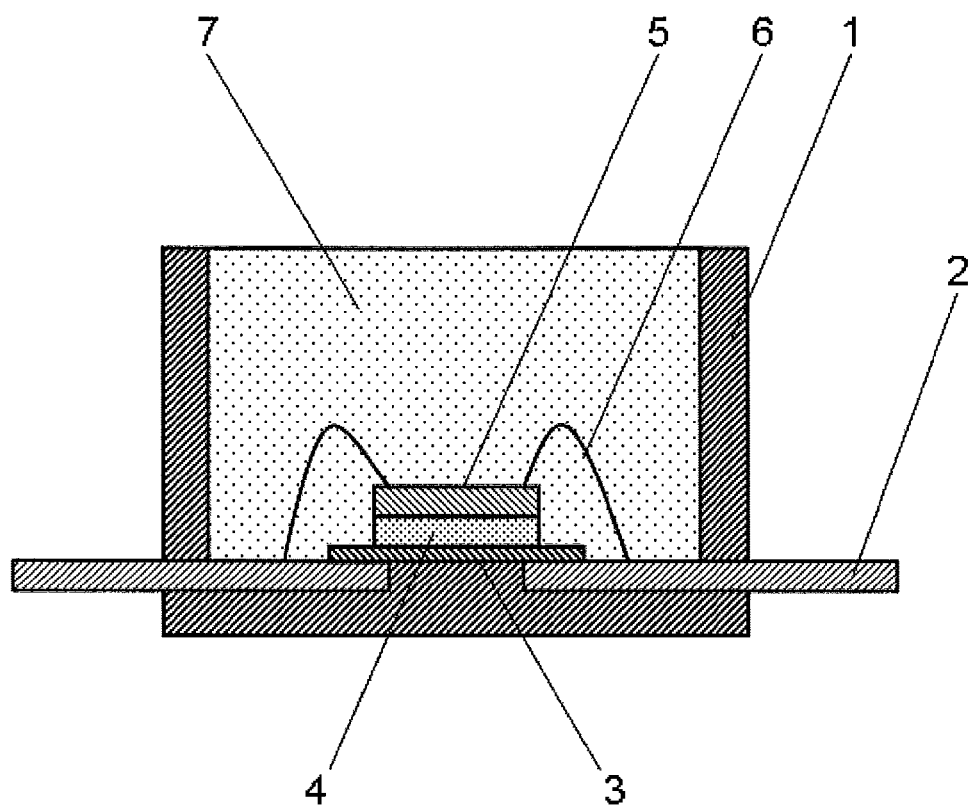

CURABLE SILICONE COMPOSITION AND OPTICAL SEMICONDUCTOR DEVICE

CROSS-REFERENCE TO RELATED APPLICATIONS

This application is the National Stage of International Patent Application No. PCT/JP2013/074780, filed on Sep. 6, 2013, which claims priority to and all the advantages of Japanese Patent Application No. 2012-197421, filed on Sep. 7, 2012, the content of which is incorporated herein by reference.

TECHNICAL FIELD

The present invention relates to a curable silicone composition and an optical semiconductor device made by using the composition.

BACKGROUND ART

Since a curable silicone composition forms a cured product that has excellent weather resistance, heat resistance, and similar properties and is rubber like (i.e. has hardness, elongation, or the like), curable silicone compositions are used as sealing agents, protective agents, or coating agents for semiconductor elements in optical semiconductor devices such as photocouplers, light emitting diodes, solid-state image sensing devices, or the like.

Various types of such curable silicone compositions have been proposed. For example, in Japanese Unexamined Patent Application Publication No. 2000-198930 an addition curing type silicone composition is proposed that comprises a diorganopolysiloxane having at least 2 alkenyl groups per molecule, an organopolysiloxane having a resin structure and having a vinyl group, an organohydrogenpolysiloxane having at least two silicon-bonded hydrogen atoms per molecule, and a hydrosilylation reaction catalyst. Moreover, in Japanese Unexamined Patent Application Publication No. 2005-076003 an addition curing type silicone composition is proposed that comprises a linear organopolysiloxane having diphenylsiloxane units and having at least 1 alkenyl group per molecule, a branched organopolysiloxane having a vinyl group and a phenyl group, an organopolysiloxane having a diorganohydrogensiloxy group, and a hydrosilylation reaction catalyst. Moreover, in Japanese Unexamined Patent Application Publication No. 2007-327019 a curable organopolysiloxane composition is proposed that comprises an organopolysiloxane that has at least 2 alkenyl groups per molecule where at least 20 mol % of the total silicon-bonded organic groups are aryl groups; an organohydrogenpolysiloxane having silicon-bonded hydrogen atoms; an organopolysiloxane having per molecule at least 5 mol % of the total silicon-bonded organic groups as alkenyl groups, having at least 5 mol % of the total silicon-bonded organic groups as aryl groups, having at least 5 mol % of the total silicon-bonded organic groups as alkoxy groups, and having at least 5 mol % of the total silicon-bonded organic groups as epoxy-containing organic groups; and a hydrosilylation reaction catalyst. Further, in Japanese Unexamined Patent Application Publication No. 2008-001828 a curable organopolysiloxane composition is proposed that comprises an organopolysiloxane having per molecule at least 2 alkenyl groups and at least one aryl group, an organopolysiloxane having per molecule at least 0.5 mol % of total silicon-bonded organic groups as alkenyl groups and at least 25 mol % of total silicon-bonded organic groups as aryl groups, an organopolysiloxane having per molecule an average of at least two silicon-bonded aryl groups and an average of at least two silicon-bonded hydrogen atoms, and a hydrosilylation reaction catalyst.

However, when the curable silicon compositions proposed in the aforementioned patent documents are used as sealing resins for semiconductor elements, the cured product of the curable silicone composition has poor thermal shock resistance. Thus there have been problems such as the ready occurrence of cracks in the resin due to thermal shock, and particularly failures such as non-lighting when the aforementioned semiconductor element is a light emitting diode.

The objects of the present invention are to provide a curable silicone composition that forms a cured product having excellent transparency and thermal shock resistance, and by using this composition, to provide an optical semiconductor device that has excellent reliability.

DISCLOSURE OF INVENTION

The inventors of the present invention performed a dedicated investigation in order to solve the aforementioned problem, and the present invention was achieved by discovery that thermal shock resistance was markedly improved for a cured product obtained by curing a curable silicone composition obtained by addition to the hydrosilylation reaction curable silicone composition of at least one type of compound selected from among triazole-based compounds with the exception of non-substituted benzotriazole.

The curable silicone composition of the present invention is a hydrosilylation reaction curable silicone composition for sealing, coating, or adhering of an optical semiconductor element; the curable silicone composition comprising at least one type of compound selected from the group including triazole-based compounds with the exception of non-substituted benzotriazole.

The curable silicone composition of the present invention preferably includes:
(A) an organopolysiloxane having at least two aliphatic unsaturated hydrocarbon groups per molecule;
(B) an organohydrogenpolysiloxane having at least two silicon-bonded hydrogen atoms per molecule;
(C) at least one type of compound selected from the group consisting of triazole-based compounds with the exception of non-substituted benzotriazole; and
(D) a hydrosilylation reaction catalyst.

In the curable silicone composition of the present invention, the aforementioned component (A) preferably is an organopolysiloxane represented by the following average composition formula:

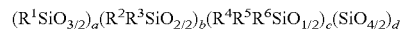

$(R^1SiO_{3/2})_a(R^2R^3SiO_{2/2})_b(R^4R^5R^6SiO_{1/2})_c(SiO_{4/2})_d$ in the formula, $R^1$ to $R^6$ may be identical or different types of monovalent hydrocarbon groups, from 0.01 to 50 mol % of all monovalent hydrocarbon groups are aliphatic unsaturated hydrocarbon groups; "a", "b", "c", and "d" represent mole ratios of the respective siloxane units and are numbers that respectively satisfy: $a+b+c+d=1.0$; $0 \le a \le 1.0$; $0 \le b \le 1.0$; $0 \le c < 0.83$; and $0 \le d < 0.50$.

Further, the aforementioned component (B) preferably is an organohydrogenpolysiloxane represented by the following average composition formula:

$R^7_eH_fSiO_{[(4-e-f)/2]}$ in the formula, $R^7$ is a substituted or non-substituted monovalent hydrocarbon group with the exception of aliphatic unsaturated hydrocarbon groups; and "e" and "f" are numbers that respectively satisfy: $1.0 \le e \le 2.0$, $0.1 < f < 1.0$, and $1.5 \le e+f < 2.7$.

In the curable silicone composition of the present invention, the aforementioned triazole-based compound is preferably selected from the group consisting of N-alkyl substituted triazoles, N-alkylaminoalkyl substituted triazoles, alkyl substituted benzotriazoles, carboxyl substituted benzotriazoles, and nitro substituted benzotriazoles.

In the curable silicone composition of the present invention, the aforementioned triazole-based compound is particularly preferably at least one type selected from the group consisting of N,N-bis(2-ethylhexyl)-[(1,2,4-triazol-1-yl) methyl]amine, tolyl triazole, carboxy benzotriazole, and nitrobenzotriazole.

Further, a content of the aforementioned triazole-based compound in the curable silicone composition is preferably 0.01 ppm to 3% by mass.

The optical semiconductor device of the present invention is fabricated by using the aforementioned curable silicone composition for sealing, coating, or adhering an optical semiconductor element.

In the aforementioned optical semiconductor device of the present invention, the optical semiconductor element is preferably a light emitting diode.

EFFECTS OF INVENTION

The curable silicone composition of the present invention is characterized as having excellent transparency and forming a cured product having excellent thermal shock resistance. Furthermore, the optical semiconductor device of the present invention exhibits excellent reliability.

BRIEF DESCRIPTION OF THE DRAWINGS

FIG. 1 is a schematic cross-sectional drawing of an example of the optical semiconductor device of the present invention.

DETAILED DESCRIPTION OF THE INVENTION

Embodiments of the present invention will be described below in detail. The present invention is not limited by the following embodiments, and various types of modifications may be made within the scope of the gist of the present invention.

[Curable Silicone Composition]

The curable silicone composition of the present invention is a hydrosilylation reaction curable silicone composition for sealing, coating, or adhering of an optical semiconductor element; the curable silicone composition comprising at least one type of compound selected from a group including triazole-based compounds with the exception of non-substituted benzotriazole.

The curable silicone composition is composed of a hydrosilylation reaction curable silicone that cures due to a hydrosilylation reaction. No particular limitation is placed on this curable silicone composition as long as the hydrosilylation reaction curable silicone composition includes at least one type of compound selected from the group including triazole-based compounds with the exception of non-substituted benzotriazole. Specifically, the curable silicone composition is exemplified by curable silicone compositions including at least an organopolysiloxane having at least 2 aliphatic unsaturated hydrocarbon groups per molecule as component (A); an organohydrogenpolysiloxane having at least two silicon-bonded hydrogen atoms per molecule as component (B); at least one type of compound selected from the group consisting of triazole-based compounds, with the exception of non-substituted benzotriazole, as component (C); and a hydrosilylation reaction catalyst as component (D).

From the standpoint of handling and processability, the curable silicone composition is preferably a liquid at 25° C. Viscosity at 25° C. of the curable silicone composition is preferably in the range of 10 mPa·s to 1,000,000 mPa·s. If the curable silicone composition is used as the sealing agent of an optical semiconductor element, viscosity at 25° C. is preferably in the range of 50 mPa·s to 50,000 mPa·s. By setting of the range of the viscosity at 25° C. of the curable silicone composition within the aforementioned range, the curable silicone composition may be readily handled, and it is possible to suppress lowering of mechanical strength. When the viscosity at 25° C. of the curable silicone composition is less than the lower limit of the aforementioned range, there is tendency for lowering of the mechanical strength of the obtained cured product. Moreover, when the upper limit of the aforementioned range of viscosity at 25° C. of the curable silicone composition is exceeded, there is a tendency for handling processability of the obtained composition to decline. Moreover, the viscosity at 25° C. of the curable silicone composition may be determined, for example, by measurement using a B type viscometer based on JIS K 7117-1.

The curable silicone composition preferably forms a cured product with a type A durometer hardness from 30 to 99 and more preferably from 35 to 95 as prescribed by JIS K 6253 when cured. By setting the hardness of the cured product of the curable silicone composition within the aforementioned limit, it is possible to attain good protection performance and durability. When the hardness of the cured product of the curable silicone composition is less than the aforementioned lower limit, strength of the cured product is deficient, and there is concern that sufficient protection performance will not be obtained. Moreover, when the hardness of the cured product of the curable silicone composition exceeds the aforementioned upper range, the cured product becomes brittle, and there is concern that sufficient durability will not be obtained.

Although the curing of the curable silicone composition progresses when left to stand at room temperature or when heated, it is preferable to heat the composition in order to cure the composition quickly. The heating temperature is preferably within the range of from 50° C. to 200° C.

The cured product of the curable silicone composition has good transparency. Specifically, an optical transmittance at wavelengths of 400 nm to 700 nm of the cured product of the curable silicone composition is preferably greater than or equal to 80%, and further preferably is greater than or equal to 90%. This preference is due to concern that, if the optical transmittance of the cured product is less than the aforementioned lower limit, reliability may be insufficient for the optical semiconductor device produced by sealing, coating, or adhering the optical semiconductor element. Furthermore, the optical transmittance of the cured product of the curable silicone composition may be found, for example, by measurement of the cured product over an optical path of 1.0 mm using a spectrophotometer.

This type of curable silicone composition adheres with excellent durability to metals such as steel, stainless steel, aluminum, copper, silver, titanium, titanium alloys, or the like; semiconductor elements such as silicon semiconductors, gallium phosphide type semiconductors, gallium arsenide type semiconductors, gallium nitride type semiconductors, or the like; and ceramics, glasses, thermosetting resins, thermoplastic resins having polar groups, or the like. In particular, adhesion durability is excellent after the cured product has undergone heating-cooling cycles. Thus the curable silicone composition may form a cured product that has excellent transparency as well as excellent thermal shock resistance. Each of the constituent elements will be explained below in detail.

An organopolysiloxane represented by the following average composition formula is suitable for use as component (A) that has at least 2 aliphatic unsaturated hydrocarbon groups per molecule.

$(R^1SiO_{3/2})_a(R^2R^3SiO_{2/2})_b(R^4R^5R^6SiO_{1/2})_c(SiO_{4/2})_d$

In this average composition formula, $R^1$ to $R^6$ may be the same or different and represents a monovalent hydrocarbon group, 0.01 to 50 mol % of all monovalent hydrocarbon groups being aliphatic unsaturated hydrocarbon groups, preferably 0.05 to 40 mol % of all monovalent hydrocarbon groups being aliphatic unsaturated hydrocarbon groups, and further preferably 0.09 to 32 mol % of all monovalent hydrocarbon groups being aliphatic unsaturated hydrocarbon groups. Moreover, "a", "b", "c", and "d" represent mole ratios of the respective siloxane units and are numbers that respectively satisfy: $a+b+c+d=1.0$, $0 \le a \le 1.0$, $0 \le b \le 1.0$, $0 \le c < 0.83$, and $0 \le d < 0.50$.

The aforementioned $R^1$ to $R^6$ each preferably has a carbon number in the range of 1 to 20, and particularly preferably has a carbon number in the range of 1 to 10. Specifically, the monovalent hydrocarbon group of $R^1$ to $R^6$ is exemplified by alkyl groups such as a methyl group, ethyl group, propyl group, butyl group, hexyl group, isopropyl group, isobutyl group, tert-butyl group, cyclohexyl group, or the like; aryl groups such as a phenyl group, tolyl group, or the like; aralkyl groups such as a benzyl group or the like; or the like. Furthermore, unsaturated aliphatic hydrocarbon groups are exemplified by alkenyl groups such as a vinyl group, allyl group, isopropenyl group, butenyl group, or the like. Furthermore, alkyl groups substituted by an acryloxy group or methacryloxy group may be cited, as exemplified by an acryloxypropyl group, methacryloxypropyl group, or the like. Furthermore, 1 or 2 or more of the hydrogen atoms of such groups may be replaced by a halogen atom such as a fluorine atom or the like.

The aliphatic unsaturated hydrocarbon group in component (A) is 0.01 mol % to 50 mol % of all monovalent hydrocarbon groups, preferably is 0.05 mol % to 40 mol % of all monovalent hydrocarbon groups, and further preferably is 0.09 mol % to 32 mol % of all monovalent hydrocarbon groups. There is concern that a cured product may not be obtained if there is excessively low aliphatic unsaturated hydrocarbon group content in component (A). Moreover, there is concern that mechanical characteristics of the obtained cured product may worsen if the aliphatic unsaturated hydrocarbon group content in component (A) is excessively high. Moreover, the aliphatic unsaturated hydrocarbon group in component (A) is preferably at both terminals of the organosiloxane molecule. The molar content (%) of the aliphatic unsaturated hydrocarbon group in the total monovalent hydrocarbon groups in component (A) may be measured by analytical methods exemplified by Fourier transform infrared spectrophotometer (FT-IR), nuclear magnetic resonance (NMR), gel permeation chromatography (GPC), etc.

An organopolysiloxane for component (A) is a liquid or solid at 25° C. If component (A) is a liquid at 25° C., the viscosity of the liquid at 25° C. is preferably in the range of 1 mPa·s to 1,000,000 mPa·s, and further preferably is in the range of 10 mPa·s to 1,000,000 mPa·s. The viscosity at 25° C. of the organopolysiloxane may be determined, for example, based on JIS K 7117-1 using a B type viscometer.

An organohydrogenpolysiloxane for component (B) that has at least two silicon-bonded hydrogen atoms per molecule is used as a crosslinking agent for this composition. A suitable organohydrogenpolysiloxane is exemplified by the compound represented by the following average composition formula.

$R^7_eH_fSiO_{[(4-e-f)/2]}$

In this average composition formula, $R^7$ is a substituted or unsubstituted monovalent hydrocarbon group with the exception of aliphatic unsaturated hydrocarbon groups. The $R^7$ groups is exemplified by alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group, decyl group, or the like; aryl groups such as a phenyl group, tolyl group, xylyl group, naphthyl group, or the like; aralkyl groups such as a benzyl group, phenylethyl group, phenylpropyl group, or the like; and halogen-substituted alkyl groups such as a 3-chloropropyl group, 2-bromoethyl group, 3,3,3-trifluoropropyl group, or the like. Moreover, in the formula, "e" and "f" are numbers that respectively satisfy: $1.0 < e \le 2.0$, $0.1 < f < 1.0$, and $1.5 \le e+f < 2.7$.

No particular limitation is placed on the molecular structure of component (B), and this structure may be linear, partially branched linear, branching, cyclic, or three-dimensional mesh-like. The molecular structure of component (B) is preferably partially branched linear, branching, or three-dimensional mesh-like.

An organohydrogenpolysiloxane for component (B) is a liquid or solid at 25° C. If component (B) is a liquid at 25° C., the viscosity of the liquid at 25° C. is preferably less than or equal to 10,000 mPa·s, further preferably is in the range of 0.1 mPa·s to 5,000 mPa·s, and most preferably is in the range of 0.5 mPa·s to 1,000 mPa·s. The viscosity at 25° C. of the organohydrogenpolysiloxane may be determined, for example, based on JIS K 7117-1 using a B type viscometer.

No particular limitation is placed on component (B) as long as the organohydrogenpolysiloxane is capable of attaining the object of the present invention. Component (B) may be selected as one type or two or more types from among the group composed of 1,1,3,3-tetramethyldisiloxane, 1,3,5,7-tetramethylcyclotetrasiloxane, tris(dimethylhydrogensiloxy)methylsilane, tris(dimethylhydrogensiloxy)phenylsilane, 1-glycidoxypropyl-1,3,5,7-tetramethylcyclotetrasiloxane, 1,5-diglycidoxypropyl-1,3,5,7-tetramethylcyclotetrasiloxane, 1-glycidoxypropyl-5-trimethoxysilylethyl-1,3,5,7-tetramethylcyclotetrasiloxane, methylhydrogenpolysiloxane capped at both molecular terminals with trimethylsiloxy groups, dimethylsiloxane-methylhydrogensiloxane copolymer capped at both molecular terminals with trimethylsiloxy groups, dimethylpolysiloxane capped at both molecular terminals with dimethylhydrogensiloxy groups, dimethylsiloxane-methylhydrogensiloxane copolymer capped at both molecular terminals with dimethylhydrogensiloxy groups, methylhydrogensiloxane-diphenylsiloxane copolymer capped at both molecular terminals with trimethylsiloxy groups, methylhydrogensiloxane-diphenylsiloxane-dimethylsiloxane copolymer capped at both molecular terminals with trimethylsiloxy groups, trimethoxysilane polymer, copolymers composed of $(CH_3)_2HSiO_{1/2}$ units and $SiO_{4/2}$ units, and copolymers composed of $(CH_3)_2HSiO_{1/2}$ units and $SiO_{4/2}$ units and $(C_6H_5)SiO_{3/2}$ units, or the like.

Although no particular limitation is placed on the content of component (B) in the curable silicone composition, relative to 1 mol of the aliphatic unsaturated hydrocarbon groups in component (A), the amount of silicon-bonded hydrogen atoms in component (B) is preferably 0.1 mol to 10 mol, and particularly preferably is 0.5 mol to 5 mol. When the molar ratio of the silicon-bonded hydrogen atoms in component (B) to the aliphatic unsaturated hydrocarbon groups in component (A) is within the aforementioned range, it is possible to suppress lowering of mechanical characteristics of the cured product. When the molar ratio of the silicon-bonded hydrogen atoms in component (B) to the aliphatic unsaturated hydrocarbon groups in component (A) is less than the aforementioned lower limit, there is a tendency for the obtained composition not to cure sufficiently. Further, when the molar ratio of the silicon-bonded hydrogen atoms in component (B) to the aliphatic unsaturated hydrocarbon groups in component (A) is greater than the aforementioned upper limit, bubbles occur in the cured product, and there is a tendency for mechanical properties to markedly worsen. The amount of the aliphatic unsaturated hydrocarbon group in component (A) may be measured by the aforementioned analytical methods. The amount of the silicon-bonded hydrogen atoms in component (B) may be measured by analytical methods exemplified by Fourier transform infrared spectrophotometer (FT-IR), nuclear magnetic resonance (NMR), gel permeation chromatography (GPC), etc.

Triazole-based compounds with the exception of unsubstituted benzotriazoles for component (C) are used for imparting thermal shock resistance to the cured product of the curable silicone composition. No particular limitation is placed on this type of triazole-based compound as long as the triazole compound is a triazole-based compound with the exception of unsubstituted benzotriazole. Such triazole-based compounds with the exception of unsubstituted benzotriazole are exemplified by triazoles such as 1H-1,2,3-triazole, 2H-1,2,3-triazole, 1H-1,2,4-triazole, 4H-1,2,4-triazole, or the like; and triazole-based compounds having a structure condensed with an aromatic ring such as a benzene ring, naphthalene ring, or the like. The substituting group may substitute on this triazole ring and/or aromatic ring. The substituting group may have 1 to 12 carbon atoms. The structure of the substituting group may be saturated or unsaturated, and may be linear or branched. An aliphatic ring or aromatic ring may be included in the cyclic structure. One type or two or more types of atoms selected from the following group may be included: oxygen atom (e.g. hydroxyl group, carbonyl group, carboxyl group, ether group, ester group, or the like); nitrogen atom (e.g. amino group, amido group, nitro group, cyano group, or the like); sulfur atom (e.g. thiol group, sulfide group, or the like), and halogen atom (e.g. fluorine atom, chlorine atom, bromine atom, iodine atom, or the like). Specific examples of this type of triazole-based compound include 2-(2'-hydroxy-5'-methylphenyl)benzotriazole, 1H-1,2,3-triazole, 2H-1,2,3-triazole, 1H-1,2,4-triazole, 4H-1,2,4-triazole, tolyl triazole, carboxybenzotriazole, methyl 1H-benzotriazole-5-carboxylate, 3-amino-1,2,4-triazole, 4-amino-1,2,4-triazole, 5-amino-1,2,4-triazole, 3-mercapto-1,2,4-triazole, chlorobenzotriazole, nitrobenzotriazole, aminobenzotriazole, cyclohexano[1,2-d]triazole, 4,5,6,7-tetrahydroxytolyltriazole, 1-hydroxybenzotriazole, ethylbenzotriazole, naphthotriazole, 1-N,N-bis(2-ethylhexyl)-[(1,2,4-triazol-1-yl)methyl] amine, 1-[N,N-bis(2-ethylhexyl)aminomethyl] benzotriazole, 1-[N,N-bis(2-ethylhexyl)aminomethyl]tolyl triazole, 1-[N,N-bis(2-ethylhexyl)aminomethyl]carboxybenzotriazole, 1-[N,N-bis(2-hydroxyethyl)-aminomethyl] benzotriazole, 1-[N,N-bis(2-hydroxyethyl)-aminomethyl] tolyl triazole, 1-[N,N-bis(2-hydroxyethyl)-aminomethyl] carboxybenzotriazole, 1-[N,N-bis(2-hydroxypropyl) aminomethyl]carboxybenzotriazole, 1-[N,N-bis(1-butyl) aminomethyl]carboxybenzotriazole, 1-[N,N-bis(1-octyl) aminomethyl]carboxybenzotriazole, 1-(2',3'-di-hydroxypropyl)benzotriazole, 1-(2',3'-di-carboxyethyl) benzotriazole, 2-(2'-hydroxy-3',5'-di-tert-butylphenyl) benzotriazole, 2-(2'-hydroxy-3',5'-amylphenyl) benzotriazole, 2-(2'-hydroxy-4'-octoxyphenyl) benzotriazole, 2-(2'-hydroxy-5'-tert-butylphenyl) benzotriazole, 1-hydroxybenzotriazole-6-carboxylic acid, 1-oleoylbenzotriazole, 1,2,4-triazol-3-ol, 5-amino-3-mercapto-1,2,4-triazole, 5-amino-1,2,4-triazole-3-carboxylic acid, 1,2,4-triazole-3-carboxyamide, 4-aminourazole, and 1,2,4-triazol-5-one. Among these compounds, N-alkyl or N-alkylaminoalkyl substituted triazoles, and alkyl, carboxy, or nitro substituted benzotriazole are preferred. Tolyltriazole, carboxybenzotriazole, methyl 1H-benzotriazole-5-carboxylate, N,N-bis(2-ethylhexyl)-[(1,2,4-triazol-1-yl) methyl]amine, or the like are particularly preferred. These triazole-based compounds may be used as one type or as a combination of two or more types.

The content of component (C) in the curable silicone composition is in the range of 0.01 ppm to 3% by mass, and preferably is in the range of 0.1 ppm to 1% by mass. By setting the content of component (C) in the aforementioned range, it is possible to obtain a cured product that has good thermal shock resistance. When the content of component (C) is less than the lower limit of the aforementioned range, there is concern that sufficient suppression may not be possible of the occurrence of peeling and cracks due to thermal shock. Moreover, when the content of component (C) exceeds the upper limit of the aforementioned range, there is concern that physical properties of the obtained cured product may decline.

A hydrosilylation reaction catalyst for component (D) is used for promotion of the hydrosilylation reaction of the curable silicone composition. Such component (D) is preferably a platinum group element catalyst or a platinum group element compound catalyst, and examples include platinum-based catalysts, rhodium-based catalysts, and palladium-based catalysts. Among such hydrosilylation catalysts, platinum-based catalyst are preferred due to the ability to remarkably promote the hydrosilylation reaction between component (A) and component (B). Examples of such platinum-based catalysts include platinum fine powders, platinum black, chloroplatinic acid, alcohol-modified products of chloroplatinic acid, complexes of chloroplatinic acid and diolefin, platinum-olefin complexes, platinum-carbonyl complexes such as platinum bis-(acetoacetate) and platinum bis-(acetylacetonate), chloroplatinic acid-alkenylsiloxane complexes such as chloroplatinic acid-divinyltetramethyldisiloxane complexes and chloroplatinic acid-tetravinyltetramethylcyclotetrasiloxane complexes, platinum-alkenylsiloxane complexes such as platinum-divinyltetramethyldisiloxane complexes and platinum-tetravinyltetramethylcyclotetrasiloxane complexes, and complexes of chloroplatinic acid and acetylene alcohols. Platinum-alkenylsiloxane complexes are particularly preferable due to their excellent effect of accelerating hydrosilylation reactions. One type of these hydrosilylation reaction catalysts may be used alone, or two or more types may be used in combination.

The alkenylsiloxane used in the platinum-alkenylsiloxane complex is not particularly limited, and examples include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable due to the favorable stability of the platinum-alkenylsiloxane complex that is produced.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

No limitation is placed on the content of the hydrosilylation catalyst for component (D) as long as the content promotes curing of this composition. Specifically, the concentration expressed in mass units of the platinum group metal atom relative to the curable silicone composition is preferably in the range of 0.01 ppm to 500 ppm, further preferably is in the range of 0.01 ppm to 100 ppm, and particularly preferably is in the range of 0.1 ppm to 50 ppm. The coloration of the cured product can be suppressed when the content of component (D) is within the range described above. When the content of component (D) is less than the lower limit of the aforementioned range, there is concern that the curable silicone composition may become insufficiently cured. Further, there is concern for the occurrence of coloration of the cured product when the content of component (D) exceeds the upper limit of the aforementioned range.

The curable silicone composition may include an optional hydrosilylation reaction retardant for component (E) in order to prolong the usable time at room temperature and to improve storage stability. Examples of such a hydrosilylation reaction retardant include alkyne alcohols such as 1-ethynylcyclohexan-1-ol, 2-methyl-3-butyn-2-ol, 3,5-dimethyl-1-hexyn-3-ol, and 2-phenyl-3-butyn-2-ol; enyne compounds such as 3-methyl-3-penten-1-yne and 3,5-dimethyl-3-hexen-1-yne; methylalkenylsiloxane oligomers such as 1,3,5,7-tetramethyl-1,3,5,7-tetravinylcyclotetrasiloxane and 1,3,5,7-tetramethyl-1,3,5,7-tetrahexenylcyclotetrasiloxane; alkynoxysilanes such as dimethyl bis-(3-methyl-1-butyn-3-oxy)silane and methylvinyl bis-(3-methyl-1-butyn-3-oxy)silane, and triallylisocyanurate compounds. The content of the hydrosilylation reaction retardant is not particularly limited but is an amount sufficient to suppress gelling or to suppress curing at the time of the mixing of components (A) to (D) and is an amount sufficient to enable long-term storage. Specifically, the content of the hydrosilylation reaction retardant is preferably within the range of from 0.0001 to 5 parts by mass and more preferably within the range of from 0.01 to 3 parts by mass per 100 parts by mass of the sum of components (A) to (D).

In addition, the curable silicone composition may also contain an adhesion promoter in order to further improve adhesion to the substrate with which the composition makes contact during curing. Such an adhesion promoter is preferably an organic silicon compound having 1 or 2 or more silicon-bonded alkoxy groups per molecule. Examples of the alkoxy groups include methoxy groups, ethoxy groups, propoxy groups, butoxy groups, and methoxyethoxy groups, and methoxy groups or ethoxy groups are particularly preferable. Examples of groups other than alkoxy groups bonding with the silicon atoms of this organic silicon compound include substituted or unsubstituted monovalent hydrocarbon groups such as alkyl groups, alkenyl groups, aryl groups, aralkyl groups, and halogenated alkyl groups; epoxy group-containing monovalent organic groups such as 3-glycidoxypropyl groups, 4-glycidoxybutyl groups, or similar glycidoxyalkyl groups; 2-(3,4-epoxycyclohexyl)ethyl groups, 3-(3,4-epoxycyclohexyl)propyl groups, or similar epoxycyclohexylalkyl groups; 4-oxylanylbutyl groups, 8-oxylanyloctyl groups, or similar oxylanylalkyl groups; acrylic group-containing monovalent organic groups such as 3-methacryloxypropyl groups; isocyanate groups; isocyanurate groups; and hydrogen atoms. The organic silicon compound preferably has a group that can react with the aliphatic unsaturated hydrocarbon groups or silicon-bonded hydrogen atoms in the present composition. Specifically, the organic silicon compound preferably has silicon-bonded aliphatic unsaturated hydrocarbon groups or silicon-bonded hydrogen atoms.

In order to impart good adhesion toward various types of substrates, the adhesion promoter preferably is an organosilicon compound that has one or two or more epoxy-containing monovalent organic groups per molecule. This type of organosilicon compound is exemplified by organosilane compounds, organosiloxane oligomers and alkyl silicates. A molecular structure of the organosiloxane oligomer or alkyl silicate is exemplified by a linear structure, partially branched linear structure, branched chain structure, ring-shaped structure, and net-shaped structure. A linear chain structure, branched chain structure, and net-shaped structure are particularly preferred. Examples of this type of organosilicon compound include silane compounds such as 3-glycidoxypropyltrimethoxysilane, 2-(3,4-epoxycyclohexyl)ethyltrimethoxysilane, 3-methacryloxypropyltrimethoxysilane, or the like; siloxane compounds per molecule having a silicon-bonded alkenyl group or having 1 or 2 or more silicon-bonded hydrogen atoms, and silicon-bonded alkoxy groups; mixtures of siloxane compounds or silane compounds having 1 or 2 or more silicon-bonded alkoxy groups and siloxane compounds having 1 or 2 or more silicon-bonded hydroxy groups and silicon-bonded alkenyl groups; methyl polysilicate; ethyl polysilicate; epoxy group-containing ethyl polysilicate; or the like.

The adhesion promoter is preferably a low-viscosity liquid, and the viscosity at 25° C. of the adhesion promoter is not particularly limited but is preferably within the range of from 1 to 500 mPa·s. In the present composition, the content of the adhesion promoter is not particularly limited but is preferably within the range of from 0.01 to 10 parts by mass and more preferably within the range of from 0.1 to 3 parts by mass per 100 parts by mass of the sum of components (A) to (D). Furthermore, the viscosity of the adhesion promoter at 25° C. may be measured, for example, using a B-type viscometer based on JIS K 7117-1.

The curable silicone composition may also contain 1 or 2 or more types of inorganic fillers selected from silica, glass, alumina, zinc oxide, and the like; silicone rubber powders; resin powders such as silicone resins and polymethacrylate resins; and 1 or 2 or more types of components selected from heat resistant agents, dyes, pigments, flame retardants, solvents, and the like as other optional components, as long as the object of the present invention is not undermined.

[Optical Semiconductor Device]

The optical semiconductor device of the present invention will now be explained in detail. The optical semiconductor device of the present invention is characterized in that the optical semiconductor element within a housing is sealed using a cured product of a sealing agent composed of the aforementioned composition, or the optical semiconductor element within the housing is coated by a cured product of a coating agent composed of the aforementioned composition, or the optical semiconductor device is glued by the cured product of an adhesive composed of the aforementioned composition. Specific examples of the optical semiconductor element include light-emitting diodes (LEDs), semiconductor lasers, photodiodes, phototransistors, solid-state image sensing devices, and light emitters and receivers for photocoupler, and the optical semiconductor element is preferably a light-emitting diode (LED).

Since light emission occurs from the top, bottom, left, and right sides of the semiconductor in a light-emitting diode (LED), it is not preferable for the parts constituting the light-emitting diode (LED) to absorb light, and a material with high optical transmittance or high reflectivity is preferable. Therefore, it is also preferable for the substrate on which the optical semiconductor element is mounted to be a material with high optical transmittance or high reflectivity. The board upon which this optical semiconductor element is mounted is exemplified by electrically conductive metals such as silver, gold, copper, or the like; non-electrically conductive metals such as aluminum, nickel, or the like; thermoplastic resins such as PPA, LCP, or the like intermixed with white pigments; thermoplastic resins such as epoxy resins, BT resins, polyimide resins, silicone resins, or the like including white pigment; ceramics such as alumina, aluminum nitride, or the like; or the like. The curable silicone composition has favorable thermal shock resistance with respect to the optical semiconductor element and the substrate, and the resulting optical semiconductor device can demonstrate good reliability.

The optical semiconductor device will now be explained by means of FIG. 1. FIG. 1 is a cross-sectional view of a stand-alone surface-mounted light emitting diode (LED) device that is an example of an optical semiconductor device. The light emitting diode (LED) device is produced by using an adhesive 4 for die bonding of a light emitting diode (LED) chip 5 on a die pad 3 within a polyphthalamide (PPA) resin housing 1, performing wire bonding by a bonding wire 6 between the light emitting diode (LED) chip 5 and an inner lead 2, and using a sealing material 7 to seal the light emitting diode (LED) chip 5, the inner lead 2, and the bonding wire together with the inner wall of the resin housing. In the optical semiconductor device, the curable silicone composition of the present invention is used as the composition for forming the adhesive 4 and/or sealing material 7.

EXAMPLES

The curable silicone composition of the present invention will be described in detail hereinafter using practical examples and comparative examples. However, the present invention is not limited by the description of the below listed practical examples.

Practical Examples 1 to 4 and Comparative Examples 1 to 4

The following components were uniformly mixed according to the compositions shown in Table 1 to prepare the curable silicone compositions of Practical Examples 1 to 4 and Comparative Examples 1 to 4. In the formulae, Vi represents a vinyl group, Me represents a methyl group, and Ph represents a phenyl group. Moreover, within Table 1, "SiH/Vi" represents the total moles of silicon-bonded hydrogen atoms in component (B) per 1 mole of total vinyl groups in the component (A).

The following components were used as component (A). The viscosity was the value at 25° C. and was measured using a type B viscometer in accordance with JIS K 7117-1.

Component (a-1): methylphenylpolysiloxane (vinyl group content=1.27% by mass) that has a viscosity of 1,000 mPa·s and the following average formula:

$$Me_2ViSiO(MePhSiO)_{30}SiMe_2Vi$$

Component (a-2): methylphenylpolysiloxane (vinyl group content=0.33% by mass) that has a viscosity of 15,000 mPa·s and the following average formula:

$$Me_2ViSiO(MePhSiO)_{120}SiMe_2Vi$$

Component (a-3): dimethylpolysiloxane capped at both molecular terminals with dimethylvinylsiloxy groups (vinyl group content=0.48% by mass) and that has a viscosity of 300 mPa·s and the following average formula:

$$Me_2ViSiO(Me_2SiO)_{150}SiMe_2Vi$$

Component (a-4): dimethylpolysiloxane capped at both molecular terminals with dimethylvinylsiloxy groups (vinyl group content=0.15% by mass) and that has a viscosity of 10,000 mPa·s and the following average formula:

$$Me_2ViSiO(Me_2SiO)_{500}SiMe_2Vi$$

Component (a-5): organopolysiloxane having at least 2 vinyl groups per molecule (vinyl group content=5.6% by mass) and that is a toluene-soluble white solid at 25° C. and has the following average unit formula:

$$(PhSiO_{3/2})_{0.75}(Me_2ViSiO_{1/2})_{0.25}$$

Component (a-6): organopolysiloxane having at least 2 vinyl groups per molecule (vinyl group content=2.3% by mass) and that is a toluene-soluble white solid at 25° C. and has the following average unit formula:

$$(PhSiO_{3/2})_{0.75}(MeViSiO_{2/2})_{0.10}(Me_2SiO_{2/2})_{0.15}$$

Component (a-7): organopolysiloxane having at least 2 vinyl groups per molecule (vinyl group content=4.2% by mass) and that is a toluene-soluble white solid at 25° C. and has the following average unit formula:

$$(Me_2ViSiO_{1/2})_{0.15}(Me_3SiO_{1/2})_{0.38}(SiO_{4/2})_{0.47}(HO_{1/2})_{0.01}$$

Component (a-8): organopolysiloxane resin having at least 2 vinyl groups per molecule (vinyl group content=3.4% by weight) and that is a toluene-soluble white solid at 25° C. and has the following average unit formula:

$$(Me_2ViSiO_{1/2})_{0.13}(Me_3SiO_{1/2})_{0.45}(SiO_{4/2})_{0.42}(HO_{1/2})_{0.01}$$

The following components were used as component (B). The viscosity was the value at 25° C. and was measured using a type B viscometer in accordance with JIS K 7117-1.

Component (b-1): diphenylpolysiloxane capped at both molecular terminals with dimethylhydrogensiloxy groups (content of silicon-bonded hydrogen atoms=0.6% by mass), having a viscosity of 5 mPa·s, and represented by the following average formula:

$$HMe_2SiO(Ph_2SiO)SiMe_2H$$

Component (b-2): branched chain organopolysiloxane containing at least two silicon-bonded hydrogen atoms per molecule (content of silicon-bonded hydrogen atoms=0.65% by mass), having a viscosity of 25 mPa·s, and represented by the following average unit formula:

$$(PhSiO_{3/2})_{0.4}(HMe_2SiO_{1/2})_{0.6}$$

Component (b-3): polymethylhydrogensiloxane capped at both molecular terminals with trimethylsiloxy groups (content of silicon-bonded hydrogen atoms=1.6% by mass), having a viscosity of 20 mPa·s, and represented by the following average formula:

$Me_3SiO(MeHSiO)_{15}SiMe_3$

Component (b-4): dimethylsiloxane-methylhydrogensiloxane capped at both molecular terminals with trimethylsiloxy groups (content of silicon-bonded hydrogen atoms=1.42% by mass), having a viscosity of 5 mPa·s, and represented by the following average formula:

$Me_3SiO(MeHSiO)_{15}SiMe_3$

The following components were used as component (C).
Component (c-1): N,N-bis(2-ethylhexyl)-[(1,2,4-triazol-1-yl)methyl]amine
Component (c-2): tolyl triazole
Component (c-3): carboxybenzotriazole
Component (c-4): nitrobenzotriazole
Component (c-5): benzotriazole A 1,3-divinyltetramethyldisiloxane solution (platinum metal content=about 4,000 ppm) of a platinum complex of 1,3-divinyltetramethyldisiloxane was used as component (D).

1-ethynylcyclohexan-1-ol was used as component (E).

TABLE 1

| Component | | Practical Example 1 | Practical Example 2 | Practical Example 3 | Practical Example 4 |
|---|---|---|---|---|---|
| Component A | a-1 | 45 | 10 | — | — |
| | a-2 | — | 10 | — | — |
| | a-3 | — | — | 30 | — |
| | a-4 | — | — | 28 | 29 |
| | a-5 | 40 | 45 | — | — |
| | a-6 | — | 15 | — | — |
| | a-7 | — | — | 35 | — |
| | a-8 | — | — | — | 60 |
| Component B | b-1 | 15 | 15 | — | — |
| | b-2 | — | 5 | — | — |
| | b-3 | — | — | 7 | — |
| | b-4 | — | — | — | 11 |
| Component C | c-1 | 0.1 | — | — | — |
| | c-2 | — | 0.1 | — | — |
| | c-3 | — | — | 0.1 | — |
| | c-4 | — | — | — | 0.1 |
| | c-5 | — | — | — | — |
| Component D | | 0.2 | 0.2 | 0.2 | 0.2 |
| Component E | | 0.1 | 0.1 | 0.1 | 0.1 |
| SiH/Vi | | 0.9 | 1.1 | 1.8 | 2.0 |
| Hardness of cured product | | 45 | 65 | 70 | 94 |
| Optical transmittance (%) | | 98 | 98 | 98 | 98 |
| Thermal shock resistance | Initial period crack generation rate prior to thermal shock cycle | 0/20 | 0/20 | 0/20 | 0/20 |
| | Initial period non-lighting rate prior to thermal shock cycle | 0/20 | 0/20 | 0/20 | 0/20 |
| | Crack generation rate after thermal shock cycle | 0/20 | 0/20 | 0/20 | 0/20 |
| | Non-lighting rate after thermal shock cycle | 0/20 | 0/20 | 0/20 | 0/20 |

| Component | | Comparative Example 1 | Comparative Example 2 | Comparative Example 3 | Comparative Example 4 |
|---|---|---|---|---|---|
| Component A | a-1 | 58 | 20 | — | — |
| | a-2 | — | 15 | — | — |
| | a-3 | — | — | 40 | — |
| | a-4 | — | — | 30 | 29 |
| | a-5 | 30 | 40 | — | — |
| | a-6 | — | 10 | — | — |
| | a-7 | — | — | 25 | — |
| | a-8 | — | — | — | 60 |
| Component B | b-1 | 12 | 10 | — | — |
| | b-2 | — | 5 | — | — |
| | b-3 | — | — | 5 | — |
| | b-4 | — | — | — | 11 |
| Component C | c-1 | — | — | — | — |
| | c-2 | — | — | — | — |
| | c-3 | — | — | — | — |
| | c-4 | — | — | — | — |
| | c-5 | 0.1 | — | — | — |
| Component D | | 0.2 | 0.2 | 0.2 | 0.2 |
| Component E | | 0.1 | 0.1 | 0.1 | 0.1 |
| SiH/Vi | | 0.8 | 0.9 | 1.7 | 2.0 |
| Hardness of cured product | | 45 | 65 | 70 | 94 |
| Optical transmittance (%) | | 98 | 98 | 98 | 98 |

TABLE 1-continued

| Thermal shock resistance | Initial period crack generation rate prior to thermal shock cycle | 0/20 | 0/20 | 0/20 | 0/20 |
|---|---|---|---|---|---|
| | Initial period non-lighting rate prior to thermal shock cycle | 0/20 | 0/20 | 0/20 | 0/20 |
| | Crack generation rate after thermal shock cycle | 0/20 | 2/20 | 3/20 | 7/20 |
| | Non-lighting rate after thermal shock cycle | 6/20 | 12/20 | 5/20 | 13/20 |

[Evaluations and Results]

For the curable silicone compositions obtained in the Practical Examples 1 to 4 and Comparative Examples 1 to 4, (a) the hardness of the cured product was measured, (b) the initial period crack generation rate of the sealing material was measured, (c) the initial period non-lighting rate of the light emitting diodes was measured, (d) the crack generation rate after thermal shock cycle testing of the sealing material was measured, (e) the non-lighting rate after thermal shock cycle testing of the light emitting diodes was measured, and (f) the optical transmittance of the cured product was measured. The results are shown in Table 1.

For measurement of the hardness of the cured article, the curable silicone compositions obtained in Practical Examples 1 to 4 and in Comparative Examples 1 to 4 were press molded at 150° C. for 1 hour at 5 MPa pressure to produce sheet-like cured products. The hardness of the sheet-like cured product was measured by type A durometer as specified in JIS K 6253.

Measurement of the thermal shock resistance of the cured article was performed in the below described manner. Firstly, the curable silicone composition was used to produce a surface-mounted type light emitting diode (LED). During production of the surface-mounted type light emitting diode (LED), an LED chip was placed in a cylindrically shaped polyphthalamide (PPA) resin case (2.0 mm inside diameter, 1.0 mm high) with the bottom part closed and the inner lead extending from the side wall toward the central part of the inside bottom part, and with the LED chip placed on the central part of the inner lead. After deaeration of the respective curable silicone composition of Practical Example 1 to 4 or Comparative Example 1 to 4, the precursor curable silicone composition was poured into the polyphthalamide (PPA) resin case electrically connecting the LED and the inner lead by bonding wire. The assembly was heated for 30 minutes at 100° C. in a heating oven, and then was heated for 1 hour at 150° C. to cure the curable silicone composition and produce the surface-mounted type light emitting diodes shown in FIG. 1. Thereafter, an optical microscope was used to observe the cured article of curable silicone composition of the obtained 20 surface-mounted type light emitting diodes, and the number of cracks generated in the cured article was counted. Moreover, illumination testing was performed by passing electrical current, and the number of non-lighting elements was counted.

The thermal shock cycle test was performed by subjecting 20 surface-mounted type light emitting diodes (LED) to 500 cycles of the below described cycle composed of (i) and (ii).
(i) Maintenance for 30 minutes at −40° C.
(ii) Maintenance for 30 minutes at 125° C.
Thereafter, an optical microscope was used for observation of the cured product of curable silicone composition for 20 surface-mounted light emitting diodes after the thermal shock cycles, and the number of cracks generated in the cured product was counted. Moreover, illumination testing was performed by passing electrical current, and the number of non-lighting elements was counted.

Measurement of optical transmittance of the cured product was performed by placing the curable silicone composition between two transparent glass plates, and heating the assembly for 1 hour at 150° C. to cure the curable silicone composition to produce a test piece having an optical path length of 0.1 mm. The optical transmittance of this test piece was measured at 25° C. using a recording spectrophotometer capable of measurement at desired wavelengths in visible light (400 nm to 700 nm wavelength). Within Table 1, the recorded value of optical transmittance is the value at 450 nm wavelength.

From Table 1, there was no occurrence of cracking in the sealing materials of the cured products of the curable compositions of the Practical Examples 1 to 4, there was no occurrence of light emitting diode lighting failures, and these practical examples displayed high thermal shock resistance.

INDUSTRIAL APPLICABILITY

The curable silicone composition of the present invention is useful as a sealing agent or adhesive for optical semiconductor elements such as light emitting diodes (LED), semiconductor lasers, photodiodes, phototransistors, solid state imaging elements, light emitters and light receivers used for photocouplers, or the like. In addition, the optical semiconductor device of the present invention is useful as an optical semiconductor device such as an optical device, optical equipment, lighting equipment or a lighting device.

DESCRIPTION OF SYMBOLS

1 Polyphthalamide (PPA) resin housing
2 Inner lead
3 Die pad
4 Adhesive material
5 Light emitting diode (LED) chip
6 Bonding wire
7 Sealing material

The invention claimed is:
1. A hydrosilylation reaction curable silicone composition for sealing, coating, or adhering of an optical semiconductor element; the hydrosilylation reaction curable silicone composition comprising at least one compound selected from the group consisting of triazole-based compounds with the exception of non-substituted benzotriazole, wherein the triazole-based compound is selected from the group consisting of N-alkyl substituted triazoles, N-alkylaminoalkyl substituted triazoles, alkyl substituted benzotriazoles, carboxy substituted benzotriazoles, and nitro substituted benzotriazoles.

2. The hydrosilylation reaction curable silicone composition according to claim 1; wherein the hydrosilylation reaction curable silicone composition comprises:
(A) an organopolysiloxane having at least two aliphatic unsaturated hydrocarbon groups per molecule;
(B) an organohydrogenpolysiloxane having at least two silicon-bonded hydrogen atoms per molecule;
(C) at least one type of compound selected from the group consisting of triazole-based compounds with the exception of non-substituted benzotriazole; and
(D) a hydrosilylation reaction catalyst.

3. The hydrosilylation reaction curable silicone composition according to claim 2; wherein component (A) is an organopolysiloxane represented by the following average composition formula:

$(R^1SiO_{3/2})_a(R^2R^3SiO_{2/2})_b(R^4R^5R^6SiO_{1/2})_c(SiO_{4/2})_d$ wherein, $R^1$ to $R^6$ may be identical or different monovalent hydrocarbon groups, from 0.01 to 50 mol % of all monovalent hydrocarbon groups are aliphatic unsaturated hydrocarbon groups; a, b, c, and d represent mole ratios of the respective siloxane units and are numbers that respectively satisfy: a+b+c+d=1.0, 0≤a≤1.0, 0≤b≤1.0, 0≤c<0.83, and 0≤d<0.50.

4. The hydrosilylation reaction curable silicone composition according to claim 3; wherein component (B) is an organohydrogenpolysiloxane represented by the following average composition formula:

$R^7_eH_fSiO_{[(4-e-f)/2]}$ wherein, $R^7$ is a substituted or non-substituted monovalent hydrocarbon group with the exception of aliphatic unsaturated hydrocarbon groups; and e and f are numbers that respectively satisfy: 1.0≤e≤2.0, 0.1<f<1.0, and 1.5≤e+f<2.7.

5. The hydrosilylation reaction curable silicone composition according to claim 2; wherein component (B) is an organohydrogenpolysiloxane represented by the following average composition formula:

$R^7_eH_fSiO_{[(4-e-f)/2]}$ wherein, $R^7$ is a substituted or non-substituted monovalent hydrocarbon group with the exception of aliphatic unsaturated hydrocarbon groups; and e and f are numbers that respectively satisfy: 1.0≤e≤2.0, 0.1<f<1.0, and 1.5≤e+f<2.7.

6. An optical semiconductor device fabricated by using the hydrosilylation reaction curable silicone composition described in claim 1 for sealing, coating, or adhering an optical semiconductor element.

7. The optical semiconductor device according to claim 6, wherein the optical semiconductor element is a light emitting diode.

8. The hydrosilylation reaction curable silicone composition according to claim 1; wherein the triazole-based compound is selected from the group consisting of N,N-bis(2-ethylhexyl)-[(1,2,4-triazol-1-yl)methyl]amine, tolyl triazole, carboxybenzotriazole, and nitrobenzotriazole.

9. The hydrosilylation reaction curable silicone composition according to any claim 1; wherein a content of the triazole-based compound in the hydrosilylation reaction curable silicone composition is 0.01 ppm to 3% by mass.

* * * * *